US012715445B2

(12) United States Patent
Boldrini et al.

(10) Patent No.: US 12,715,445 B2
(45) Date of Patent: Aug. 25, 2026

(54) METHOD AND SYSTEM FOR THE RECOGNITION OF THE IRREGULARITIES OF A ROAD PAVEMENT

(71) Applicant: Bridgesone Europe NV/SA [BE/BE], Zaventem (BE)

(72) Inventors: Alessandro Boldrini, Rome (IT); Lorenzo Alleva, Rome (IT); Alessandra Magliozzi, Rome (IT); Vittorio Nicolosi, Rome (IT)

( * ) Notice: Subject to any disclaimer, the term of this patent is extended or adjusted under 35 U.S.C. 154(b) by 1289 days.

(21) Appl. No.: 17/608,824

(22) PCT Filed: May 4, 2020

(86) PCT No.: PCT/IB2020/054196
§ 371 (c)(1),
(2) Date: Nov. 4, 2021

(87) PCT Pub. No.: WO2020/225699
PCT Pub. Date: Nov. 12, 2020

(65) Prior Publication Data
US 2022/0274599 A1 Sep. 1, 2022

(30) Foreign Application Priority Data
May 7, 2019 (IT) ........................ 102019000006613

(51) Int. Cl.
*B60W 40/06* (2012.01)
*G01B 21/30* (2006.01)
(Continued)

(52) U.S. Cl.
CPC ............. *B60W 40/06* (2013.01); *G01B 21/30* (2013.01); *G01S 19/01* (2013.01); *G06F 30/23* (2020.01);
(Continued)

(58) Field of Classification Search
CPC ........ B60W 40/06; G01B 21/30; G01S 19/01; G06F 30/23; G07C 5/008
See application file for complete search history.

(56) References Cited

U.S. PATENT DOCUMENTS 5,343,741 A * 9/1994 Nishihara ............. B60C 23/061 340/444
6,202,020 B1 * 3/2001 Kyrtsos ................... B60T 8/172 701/80
(Continued)

FOREIGN PATENT DOCUMENTS

CN 103318180 A 9/2013
DE 102007054082 A1 7/2008
(Continued)

OTHER PUBLICATIONS

L. Sun and Y. Liu, "Review of vehicle-road vertical coupling," 2012 2nd International Conference on Consumer Electronics, Communications and Networks (CECNet), Yichang, China, 2012, pp. 2827-2830 (Year: 2012).*
(Continued)

*Primary Examiner* — Joan T Goodbody
(74) *Attorney, Agent, or Firm* — Patterson Intellectual Property Law, PC

(57) ABSTRACT

The invention concerns a method and a system for recognizing the presence of any irregularities of any road pavement.

14 Claims, 2 Drawing Sheets

(51) Int. Cl.
*G01S 19/01* (2010.01)
*G06F 30/23* (2020.01)
*G07C 5/00* (2006.01)
*G07C 5/02* (2006.01)

(52) U.S. Cl.
CPC ............... *G07C 5/008* (2013.01); *G07C 5/02* (2013.01); *B60W 2510/227* (2013.01); *B60W 2520/10* (2013.01); *B60W 2520/28* (2013.01); *B60W 2530/20* (2013.01); *B60W 2552/35* (2020.02); *B60W 2556/45* (2020.02)

(56) References Cited

U.S. PATENT DOCUMENTS

2009/0210111 A1* 8/2009 Laermer ............... B60C 23/064 73/146
2016/0161251 A1* 6/2016 Carmona ................ E01C 1/002 73/788
2017/0284824 A1 10/2017 Korzunov
2018/0082492 A1* 3/2018 Stanek ................. G07C 5/0808

FOREIGN PATENT DOCUMENTS

DE 202009012128 A1 9/2010
DE 102015203062 * 8/2016 ......... B60G 17/0185
DE 102015203062 A1 * 8/2016 ......... B60G 17/0185
DE 102015003115 A1 9/2016
JP HO8132841 * 11/1994 ........... B60G 17/015
JP 19968132841 * 5/1996 ........... B60G 17/015
JP 1996132841 * 2/2002 ............. B60K 28/16
JP 2007245887 * 9/2007 ........... B60G 17/015
JP 2013079889 A 5/2013
WO 2011054363 A1 5/2011

OTHER PUBLICATIONS

F. Seraj, N. Meratnia and P. J. M. Havinga, “RoVi: Continuous transport infrastructure monitoring framework for preventive maintenance,” 2017 IEEE International Conference on Pervasive Computing and Communications (PerCom), Kona, HI, USA, 2017, pp. 217-226 (Year: 2017).*

JP 2007245887 Merged original and translation from PE2E (Year: 2007).*

DE 102015203062 Original and translation from PE2E (Year: 2016).*

Perttunen Mikko et al.: “Distributed Road Surface Condition Monitoring Using Mobile Phones”, Sep. 2, 2011 (Sep. 2, 2011), Pervasive: International Conference On Pervasive Computing; [Lecture Notes in Computer Science; Lect Notes Computer], Springer, Berlin, Heidelberg, pp. 64-78, XP047434651, ISBN: 978-3-642-17318-9, p. 64-67, p. 70.

Anonymous: “Resonance and Natural Frequency—Pico Technology”, Sep. 22, 2017 (Sep. 22, 2017), XP055646756, Retrieved from the Internet: URL: https://www.picoauto.com/support/topic18151.html [retrieved on Nov. 4, 2021] p. 1.

International Search Authority: European Patent Office search in corresponding international application No. PCT/IB2020/054196, dated Aug. 3, 2020, 4 pages.

* cited by examiner

METHOD AND SYSTEM FOR THE RECOGNITION OF THE IRREGULARITIES OF A ROAD PAVEMENT

TECHNICAL SECTOR

The present invention relates to a method and a system for the recognition of the irregularities of a road pavement.

PRIOR ART

Road pavements must be designed in such a way as to ensure a rolling surface that is substantially regular and with little deformation in order to meet safety and comfort requirements for the motor vehicles that drive on them. As is known, in fact, the impact of a wheel of a motor vehicle against any obstacle on the road pavement (such as, for example, a sidewalk, a pothole or a speed ramp) may cause damage to the wheel pneumatic tire, in particular to the carcass (i.e., the casing) of the pneumatic tire.

More specifically, a protuberance that is externally visible upon the side of a pneumatic tire typically indicates that some cords have been broken within the carcass due to an impact since driving over objects such as curbs, speed ramps and potholes may cause individual cords to break.

If a damaged pneumatic tire (e.g. a pneumatic tire with some damaged cords) is not detected promptly and, therefore, is not promptly repaired or replaced, in continuing to drive with said damaged pneumatic tire there is a risk of completely breaking/destroying the carcass of the pneumatic tire and also of damaging the wheel rim and/or the suspension (e.g. in the case of further impacts to the damaged pneumatic tire against other obstacles).

Until now, systems were periodically implemented in order to monitor the level of regularity of individual roads, mainly for the purpose of planning maintenance work. Typically, said monitoring systems are based upon a calculation of the International Roughness Index (IRI), which represents the international index for the irregularity of road pavements.

However, in recent years, within the automotive sector, there has been a strong need for technologies for detecting road surface conditions that are able to automatically and continuously detect the presence of potential obstacles (such as sidewalks, potholes or speed ramps) and that are able to promptly report them to the drivers of such motor vehicles.

Some methods for the recognition of the irregularities of a road pavement are described, for example, in US2017284824 and in: Perttunen Mikko et al: "*Distributed Road Surface Condition Monitoring Using Mobile Phones*" (2011 Sep. 2), Intelligent virtual agent; Anonymous: "*Resonance and Natural frequency—Pico Technology*" (2017 Sep. 22).

DESCRIPTION OF THE INVENTION

The aim of the present invention is thus to provide a method for the recognition of the irregularities of a road pavement that is free from the disadvantages of the state of the art and that is, in particular, easy and inexpensive to implement.

A further aim of the present invention is thus to provide a system for the recognition of the irregularities of a road pavement that is free from the disadvantages of the state of the art and that is, in particular, easy and inexpensive to implement.

According to the present invention a method and a system are provided for the recognition of the irregularities of a road pavement according to that which is determined within the attached claims.

BRIEF DESCRIPTION OF THE DRAWINGS

The present invention will now be described with reference to the attached drawings, which show an exemplary, non-limiting embodiment, wherein.

PREFERRED EMBODIMENTS OF THE INVENTION

The applicant has experimentally verified that the normalized wheel speed (i.e., the ratio between an acquired/measured wheel speed and the corresponding motor vehicle speed) is correlated to the wheel driving over or impacting an irregularity within the road pavement. In the following section, the term irregularity refers to any obstacle potentially present upon the road pavement (such as, for example, sidewalks, potholes, curbs, speed ramps, etc.).

Based upon the results of the tests performed, the applicant has designed and developed an innovative technology to detect the irregularities of the road pavement described in the following section and including a preliminary step and an actual irregularity detection step.

More specifically, the preliminary step for the optimization of this technology involves the execution of tests that envisage pneumatic tires driving over or impacting different types of irregularities and at different speeds of the motor vehicle. The preliminary testing step is also conducted with different types of pneumatic tires with specific characteristics (in terms of pressure, size and stiffness) and with different types of vehicles with specific characteristics (for example, in terms of shock absorber stiffness).

In particular, at least three test campaigns were followed in order to study the response in relation to:

(i) the state of the road pavement and the types of irregularities of the road pavement;

(ii) the type of motor vehicle and type of pneumatic tire; and (iii) the speed of the motor vehicle.

Figure 1:
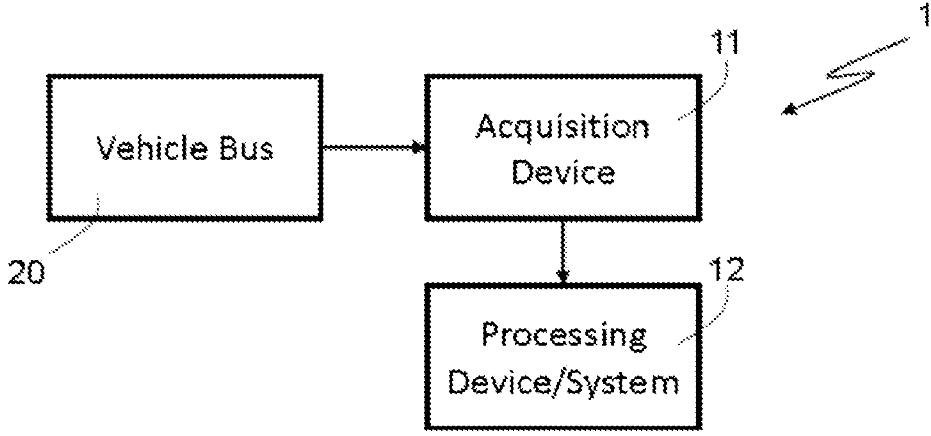
FIG. 1 schematically illustrates a first embodiment of a system that implements the method for the recognition of the irregularities of a road pavement that is the object of the present invention.

FIG. 1 schematically illustrates, by means of a block diagram, the functional architecture of a system 1 for the recognition of irregularities of a road pavement.

In particular, the system 1 for the recognition of irregularities of the road pavement includes an acquisition device 11 that is installed on board a motor vehicle equipped with two or more wheels, each equipped with a pneumatic tire, and is coupled to a vehicle bus 20 (e.g. based upon a standard Controller Area Network (CAN) bus) of said motor vehicle.

According to a preferred variant, the acquisition device 11 is fixed/bound to the chassis of the motor vehicle. In particular, the acquisition device 11 is connected to the chassis of the motor vehicle in such a way that the acquisition device 11 is subjected to the same vibrations to which the chassis of the motor vehicle is subjected.

Preferably, the acquisition device 11 is placed near an OBD connector of the motor vehicle.

The system 1 for the recognition of irregularities of a road pavement also comprises a processing device 12 that is connected, in wired or wireless mode, to the acquisition device 11.

The acquisition device 11 is configured to acquire from the vehicle bus 20 signals that are indicative of the speed of the motor vehicle and the speed of a wheel of said motor vehicle (speed signals that are, for convenience, expressed in kilometers or miles per hour). Furthermore, the acquisition device 11 is configured to provide at the output measurements that are indicative of the speeds of the motor vehicle and the speed of the wheel thereof.

The acquisition device 11 is also configured to acquire from the vehicle bus 20 signals linked to the driving of the motor vehicle. In particular, the acquisition device 11 is configured to acquire from the vehicle bus 20 signals such as vertical acceleration, yaw rate, pitch and roll (by means of a gyroscope), the steering angle of the vehicle and information relating to the position of the vehicle (by means of a GPS signal).

According to a first embodiment, the processing device 12 is configured to receive from the acquisition device 11 those measurements that are indicative of the speeds of the motor vehicle and the speed of the wheel of said motor vehicle. In addition, the processing device 12 is configured to receive from the acquisition device 11 also those measurements that are indicative of the steering angle of the vehicle and information related to the position of the vehicle (by means of a GPS signal).

In more detail, the acquisition of the signal relating to the wheel speed is performed with a sampling frequency of at least 50 Hz. Preferably, the acquisition of the signal relating to the wheel speed is performed with a sampling frequency of 100 Hz.

The processing device 12 is intended for the analysis of that measurement which is indicative of the steering angle of the wheel of said motor vehicle, wherefore transformations that alter the distribution of said measurement are used. In particular, the processing device 12 performs a FFT (Fast Fourier Transform) of that measurement which is indicative of the steering angle of the wheel of said motor vehicle over a reference section of the road pavement of variable length. The reference section of the road pavement has a variable and/or adjustable length; the reference section of the road pavement has a length of between 2 and 25 linear meters, preferably between 5 and 10 linear meters.

Said analysis by means of the FFT makes it possible to identify the frequency content of that measurement which is indicative of the steering angle of the wheel; moreover, said analysis makes it possible to highlight a minimum threshold that varies according to the driving style of the driver of the motor vehicle within the reference section.

The processing device 12 is thus configured such as to perform filtering of that measurement which is indicative of the speed of the wheel of the motor vehicle. The filtering of that measurement which is indicative of the speed of the wheel of the motor vehicle is also performed over the reference section of the road pavement.

The filtering is at least of the high-pass type; preferably, the filtering is of the band-pass type. The minimum threshold determined during the previous section by the analysis of that measurement which is indicative of the steering angle of the wheel is used within the high-pass filter; in this way it is possible to analyze only that part of the signal containing information relating to the irregularities of the road pavement and not to the driving style of the driver of the vehicle.

The processing device 12 is then configured to calculate, on the basis of those measurements that are indicative of the speeds of the motor vehicle and of the speeds of the wheel thereof, a normalized wheel speed that is indicative of a ratio (preferably a percentage ratio) of the wheel speed in relation to the speed of the motor vehicle.

Alternatively, the processing device 12 is configured to calculate, on the basis of those measurements that are indicative of the speeds of the motor vehicle and of the speeds of the wheel thereof, a normalized wheel speed that is indicative of a ratio (preferably, a percentage ratio) of the wheel speed in relation to the motor vehicle speed and to subsequently perform the filtering of the normalized wheel speed over the reference section of the road pavement.

The processing device 12 is thus configured to calculate the standard deviation of said normalized wheel speed over the reference section of the road pavement.

The preliminary step described above involves determining on the basis of the results of the tests performed one or more predefined models in order to associate the standard deviation of the normalized wheel speed over the reference section with the presence of irregularities of the road pavement. In essence, the preliminary test step includes, in succession, a sub-step in which tests are performed by having pneumatic tires drive over and/or impact different irregularities at different speeds of the motor vehicle; a sub-step in which, during the tests performed, the wheel speeds and the speeds of the motor vehicle are acquired and the normalized wheel speeds are calculated in relation to those tests performed by means of the ratio between the wheel speeds and the respective speeds of the motor vehicle; and a sub-step for the construction of at least one model for associating the standard deviation of the normalized speeds with the irregularities on the road pavement. Preferably, the preliminary test step involves the construction of a number of models depending upon the type of pneumatic tire and the type of motor vehicle.

The standard deviation of said normalized wheel speed is thus compared to the predefined models developed during the preliminary test step and is used to recognize the presence of irregularities of the road pavement. The irregularity that has just been recognized can be located by means of information related to the position of the vehicle (by means of a GPS signal).

According to a further embodiment, the processing device 12 is configured to receive from the acquisition device 11 those measurements that are indicative of vertical acceleration (along the z axis). Furthermore, the processing device 12 is configured to receive from the acquisition device 11 also those measurements that are indicative of the steering angle and information related to the position of the vehicle (by means of a GPS signal). The acquisition device 11 is also configured to acquire from the vehicle bus 20 and to transmit to the processing device 12 signals related to the driving of the motor vehicle. In particular, the acquisition device 11 is configured to acquire from the vehicle bus 20 signals such as yaw rate, pitch and roll (by means of a gyroscope).

In more detail, the acquisition of the signal related to vertical acceleration is performed with a sampling frequency of at least 10 Hz.

The processing device 12 is thus configured to initially perform filtering of that measurement which is indicative of vertical acceleration. The filtering of that measurement which is indicative of vertical acceleration is performed over a reference section of the road pavement of variable length.

The reference section of the road pavement has a variable and/or adjustable length; the reference section of the road pavement has a length of between 2 and 25 linear meters, preferably between 5 and 10 linear meters.

The filtering is preferably of the high-pass type; the minimum threshold of the high-pass filter is preferably less than or equal to 0.1 Hz.

Once the high-pass filtering has been performed, the processing device 12 is intended to analyze that measurement which is indicative of vertical acceleration by means of a transformation that alters the distribution of said measure. In particular, the processing device 12 performs a FFT (Fast Fourier Transform) of that measurement which is indicative of vertical acceleration over the reference section.

Said analysis by means of the FFT makes it possible to identify the frequency content of that measurement which is indicative of vertical acceleration over the reference section.

The processing device 12 is thus configured to calculate the standard deviation of that measurement which is indicative of vertical acceleration over the reference section. In particular, the processing device 12 is configured to calculate the standard deviation of that measurement which is indicative of vertical acceleration over the reference section and at relevant frequencies. Preferably, the relevant frequencies include a first range of vibration frequencies of the motor vehicle suspension system; preferably the first frequency range is between 1.5 Hz and 3 Hz. Preferably, the relevant frequencies also include a second range of vibration frequencies of the motor vehicle chassis.

It has been experimentally verified that a minimum threshold for the high-pass filter of less than or equal to 0.1 Hz and a range of relevant frequencies that corresponds to the vibration frequencies of the motor vehicle suspension system (between 1.5 Hz and 3 Hz) makes it possible to obtain reliable results without exceeding the computational burden of the processing device 12. Similarly, it has been experimentally verified that the best results, in terms of the reliability of the results, are obtained when the reference portion of the road surface has a length of between 2 and 25 linear meters, preferably between 5 and 10 linear meters.

The preliminary step described above involves determining on the basis of the results of the tests performed one or more predefined models in order to associate the standard deviation of that measurement which is indicative of vertical acceleration over the reference section and at relevant frequencies with the presence and size of irregularities of the road pavement.

In essence, the preliminary test step includes, in succession, a sub-step in which to perform the tests by having pneumatic tires drive over and/or impact different irregularities at different speeds of the motor vehicle; a sub-step in which to acquire the vertical acceleration during the tests performed; and a sub-step of construction of at least one model for associating the standard deviation of the vertical acceleration with the presence and size of the irregularities of the road pavement.

Preferably, the preliminary test step involves the construction of a number of models depending upon the type of pneumatic tire and the type of motor vehicle.

The standard deviation of said measurement that is indicative of the vertical acceleration over the reference section is thus compared to the predefined models developed during the preliminary test step and is used to recognize the presence of irregularities of the road pavement. The irregularity that has just been recognized can be located by means of information related to the position of the vehicle (by means of a GPS signal).

The first and second embodiments described in the previous section can be used alternatively in order to recognize the presence of irregularities of the road pavement. The first and second embodiments described in the previous section can be used at the same time and in parallel in order to recognize, with a higher degree of precision and more reliably, the presence of irregularities of the road pavement.

Figure 2:
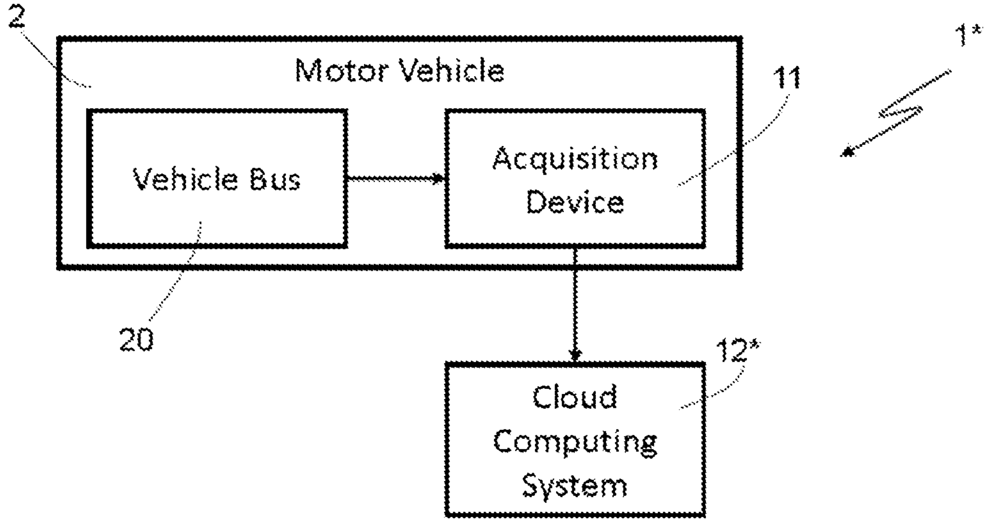
FIG. 2 schematically illustrates a first variant of the system in FIG. 1.

FIG. 2 schematically illustrates a first variant of the system 1* for the recognition of irregularities of the road pavement wherein the processing device 12 is implemented/carried out by means of a cloud-type computing system 12* that is remotely wirelessly connected to the acquisition device 11 (e.g. by means of one or more mobile communication technologies, such as GSM, GPRS, EDGE, HSPA, UMTS, LTE, LTE Advanced and/or 5th generation (or even beyond) wireless communication systems).

Figure 3:
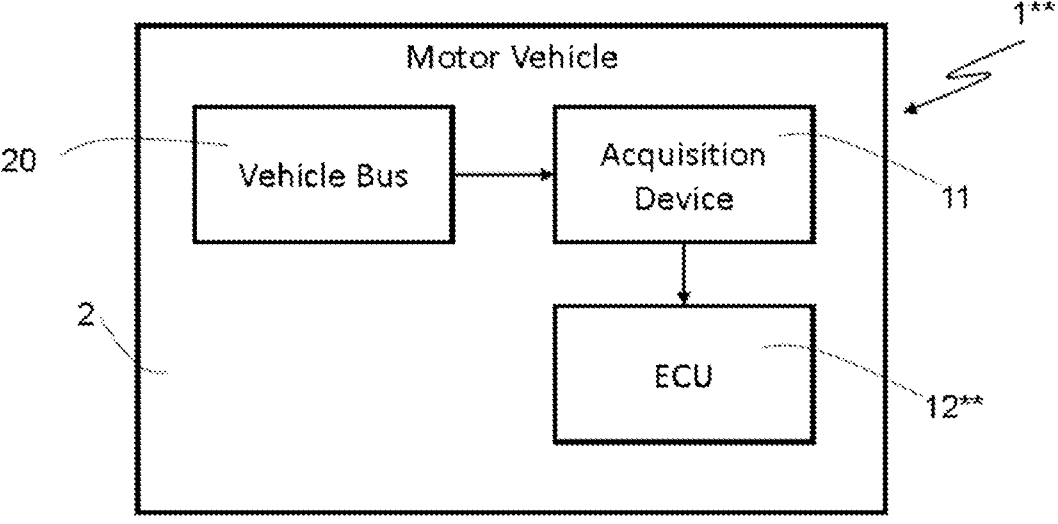
FIG. 3 schematically illustrates a second variant of the system in FIG. 1.

In contrast, with reference to FIG. 3, in a second variant of the system 1 for the recognition of irregularities of the road pavement the processing device 12 is implemented/carried out by means of a motor vehicle's electronic control unit (ECU) 12** installed on board the motor vehicle 2. The electronic control unit 12**** can conveniently be a control unit specifically dedicated to the recognition of irregularities of the road pavement, or a control unit dedicated to various tasks that also include the recognition of the irregularities of the road pavement.

The invention claimed is:

1. A method for recognition of irregularities of a road pavement, the method comprising:

during a preliminary test stage:

performing respective tests wherein pneumatic tires drive over and/or impact different irregularities at different speeds of a motor vehicle having a suspension system;

acquiring a vertical acceleration during the respective tests; and construction, based on one or more results of the respective tests, of at least one first model for associating a standard deviation of the vertical acceleration in relation to the tests performed with the irregularities on the road pavement; and during an actual recognition stage:

acquiring a vertical acceleration;

implementing high-pass filtering of the vertical acceleration, wherein a minimum filtering threshold of the high-pass filter is less than or equal to 0.1 Hz, wherein the filtering is performed on a reference section of the road pavement of variable length having a length of between 2 and 25 linear meters;

processing the vertical acceleration via a Fast Fourier Transform;

calculating a standard deviation of the processed vertical acceleration via a Fast Fourier Transform at relevant frequencies comprising a first range of vibration frequencies of the motor vehicle suspension system; and recognizing a presence and dimensions of the irregularities on the road pavement based on a comparison between said first model and the standard deviation of the processed vertical acceleration via a Fast Fourier Transform at the relevant frequencies.

2. The method of claim 1, wherein the filtering is performed on a reference section of the road pavement of variable length having a length of between 5 and 10 linear meters.

3. The method of claim 1, wherein the sub-step of acquiring the vertical acceleration is performed at a sampling rate of at least 10 Hz.

4. The method of claim 1, wherein the relevant frequencies comprise a first range of vibration frequencies of the motor vehicle suspension system between 1.5 Hz and 3 Hz.

5. The method of claim 4, wherein the relevant frequencies comprise a second range of vibration frequencies of the chassis of the motor vehicle.

6. The method of claim 1, wherein the actual recognition stage further comprises:

acquiring information regarding a position of the motor vehicle via a GPS signal; and locating any irregularities depending upon the position of the vehicle.

7. The method of claim 1, wherein the test stage further comprises:

performing the tests by having different types of pneumatic tires on different types of motor vehicle drive over and/or impact the different irregularities; and constructing a number of models in order to associate a standard deviation of the vertical acceleration with a type of pneumatic tire and/or motor vehicle.

8. The method of claim 1, wherein:

the test stage comprises:

during the tests performed, acquiring wheel speeds and the speeds of the motor vehicle, and wherein normalized wheel speeds relating to the tests performed are calculated via a ratio between the wheel speeds and the respective speeds of the motor vehicle; and construction of at least one second model for associating a standard deviation of the normalized wheel speeds with the irregularities on the road pavement; and the actual recognition stage comprises:

acquiring a steering angle of a wheel of said motor vehicle, wherein the steering angle of the wheel of said motor vehicle is acquired via a Fast Fourier Transform;

determining a minimum threshold within a frequency content of the steering angle of the wheel processed via the Fast Fourier Transform;

acquiring wheel speeds and speeds of the motor vehicle;

calculating normalized wheel speeds via a ratio between the wheel speeds and the respective speeds of the motor vehicle;

performing high-pass filtering of the wheel speeds or of the normalized wheel speeds in applying said minimum threshold; and calculating a standard deviation of the normalized wheel speeds;

wherein recognizing the presence of irregularities on the road pavement comprises using both a comparison between the first model and the standard deviation of the processed vertical acceleration via a Fast Fourier Transform at the relevant frequencies and a comparison between the second model and the standard deviation of the normalized wheel speeds.

9. A system for recognition of irregularities of a road pavement, the system comprising:

an acquisition device installed on board a motor vehicle provided with two or more wheels fitted with pneumatic tires, wherein the acquisition device is coupled to a vehicle bus of the motor vehicle and configured to acquire from the vehicle bus signals are indicative of vertical acceleration, and provide as outputs amplitudes that are indicative of the vertical acceleration; and a processing device configured to construct, based on outputs received from the acquisition device, at least one model for the recognition of irregularities of a road pavement, to store the at least one model for the recognition of the irregularities of a road pavement, and to receive from the acquisition device the amplitudes that are indicative of the vertical acceleration, wherein the processing device is further programmed to:

implement high-pass filtering of the vertical acceleration, wherein a minimum filtering threshold of the high-pass filter is less than or equal to 0.1 Hz, wherein the filtering is performed on a reference section of the road pavement of variable length having a length of between 2 and 25 linear meters;

process the high-pass filtered vertical acceleration via a Fast Fourier Transform;

calculate a standard deviation of the processed and high-pass-filtered vertical acceleration at relevant frequencies, wherein the relevant frequencies comprise a first range of frequencies of vibration of a suspension system of the motor vehicle, wherein the first range of frequencies is between 1.5 Hz and 3 Hz; and recognize a presence and dimensions of the irregularities of a road pavement based upon a comparison between said stored at least one model and the standard deviation calculated at the relevant frequencies.

10. The system of claim 9, wherein the acquisition device is fixed/bound to the chassis of the motor vehicle.

11. The system of claim 10, wherein the acquisition device is fixed/bound to the chassis of the motor vehicle in such a way that the acquisition device is commonly subjected to any vibrations to which the chassis of the motor vehicle is subjected.

12. The system of claim 9, wherein the acquisition device is placed near an OBD connector of the motor vehicle.

13. The system of claim 9, wherein the processing device is a cloud-type computing system that is remotely wirelessly connected to the acquisition device.

14. The system of claim 9, wherein the processing device is an electronic control unit installed on board the motor vehicle.

* * * * *